(12) United States Patent
Hong et al.

(10) Patent No.: US 6,650,581 B2
(45) Date of Patent: Nov. 18, 2003

(54) SEMICONDUCTOR MEMORY DEVICE, AND METHOD FOR TESTING THE SAME

(75) Inventors: Sang Hoon Hong, Kyoungki-do (KR); Si Hong Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/128,393

(22) Filed: Apr. 23, 2002

(65) Prior Publication Data

US 2003/0002367 A1 Jan. 2, 2003

(30) Foreign Application Priority Data

Jun. 29, 2001 (KR) ........................................ 2001-38018

(51) Int. Cl.$^7$ ................................................ G11C 7/00
(52) U.S. Cl. ...................................... 365/201; 365/200
(58) Field of Search ................................. 365/201, 200, 365/189.07, 194, 191

(56) References Cited

U.S. PATENT DOCUMENTS 4,673,916 A    6/1987  Kitamura et al. ..... 340/347 SH
5,408,148 A    4/1995  Pascucci et al. ............... 327/52
5,740,180 A  * 4/1998  Barel et al. .................. 714/724
5,828,612 A    10/1998 Yu et al. ...................... 365/203
6,473,346 B1 * 10/2002 Kim et al. .................. 365/201
6,483,760 B2 * 11/2002 Kang ........................... 365/201

FOREIGN PATENT DOCUMENTS

JP          11-229953         8/1999

* cited by examiner

Primary Examiner—Anh Phung
(74) Attorney, Agent, or Firm—Marshall, Gerstein & Borun LLP

(57) ABSTRACT

A semiconductor memory device and a method for testing the same which optimizes operation conditions by detecting a test cell that may easily fail in a test among the memory cells passing a burn-in test, and detecting the worst operation conditions by performing the test on the test cell. The device and method reduce power consumption in a refresh or active operation. According to the device and method set forth, a test unit tests a test cell, controls operation conditions of the semiconductor memory device according to the test result, and outputs the operation conditions. A driving unit drives the semiconductor memory device using the operation conditions controlled by the test unit.

17 Claims, 5 Drawing Sheets

SEMICONDUCTOR MEMORY DEVICE, AND METHOD FOR TESTING THE SAME

BACKGROUND

1. Technical Field

The present invention relates to semiconductor memory devices and, in particular, to semiconductor memory devices and a method for testing the same. The method can optimize operation conditions by detecting a test cell that may easily fail in a test among memory cells passing a burn-in test, and detecting the worst operation conditions by performing the test on the test cell, thereby reducing power consumption in a refresh or active operation.

2. Description of the Background Art

In general, semiconductor device tests may be classified as either product tests or as a proof tests. The product test detects a defect generated in a fabrication process such as a wafer process and an assembly process. Through the product test, it is possible to screen out the defective products to select the good products. For this reason, the product test is performed in a shipping (fabrication) process in great quantity, and requires a high throughput.

The proof test confirms whether functionality and performance of a dynamic random access memory (DRAM) satisfies requisite specifications. In research and development, the proof test is precisely executed to improve the quality of the products and to reduce a development period. During the proof test, when a fabrication defect is detected, or when the function of the products do not satisfy relevant specifications, an analysis, or failure analysis, is executed to examine failure causes. It is especially important to locate a position in the DRAM in which a defect is generated.

The DRAM test measures characteristics such as direct current (DC) and alternating current (AC) parameters and functionality, using a memory tester.

To detect an initial DRAM defects at an early stage, a burn-in test, which is performed as a function test, applies a higher voltage and temperature than the DRAM will experience.

The defect cells detected in the product and proof tests are repaired using redundancy cells to perform a normal operation.

The DRAM is operated using the passed cells under the operation conditions considered requisite for normal DRAM operation, which are selected on the basis of experimental data.

As described above, the DRAM should be designed to have a sufficient operation margin, so that it can be operated in the worst conditions. If the sufficient operation margin is not obtained, a number of defect cells can be detected, and thus a usable chip may be detected as a defect chip, which results in low production yield.

For example, to solve the foregoing problem, a method of shortening a refresh period has been suggested to obtain a sufficient margin. However, according to this method, power consumption is increased.

Moreover, when the margin is sufficiently set up in the operation conditions, operation speed of the DRAM decreases. In order to prevent reduction of the operation speed of the DRAM, a high voltage can be applied. However, the use of high voltage also causes high power consumption. For example, the operation speed of a DRAM is increased merely by setting up a sense amplifier driving voltage as a high voltage, which results in increased power consumption.

SUMMARY

The disclosed semiconductor memory device may include a memory cell array, a test unit and a driving unit. The memory cell array may comprise a test cell determined to be a worst cell one among memory cells passing a first test. The test unit performs a second test on the test cell under predetermined operation conditions, repeatedly performing the second test after adjusting the operation conditions of the test cell according to the result of the second test and finally outputting the final operation conditions. The driving unit drives the memory cell array using the final operation conditions obtained from the test unit.

In addition, a method for testing a semiconductor memory device is disclosed. The method may include detecting a test cell that may easily fail among the cells passing a first test, repairing the test cell, and memorizing an address of the test cell. The method may also include a test step for performing a second test on the test cell in predetermined operation conditions by using the address of the test cell and returning to the test step after adjusting the operation conditions, when the test cell passes the second test. The method may also include providing the operating conditions used in the test step as driving conditions of a memory cell array, when the test cell fails in the second test.

DETAILED DESCRIPTION

Figure 1:
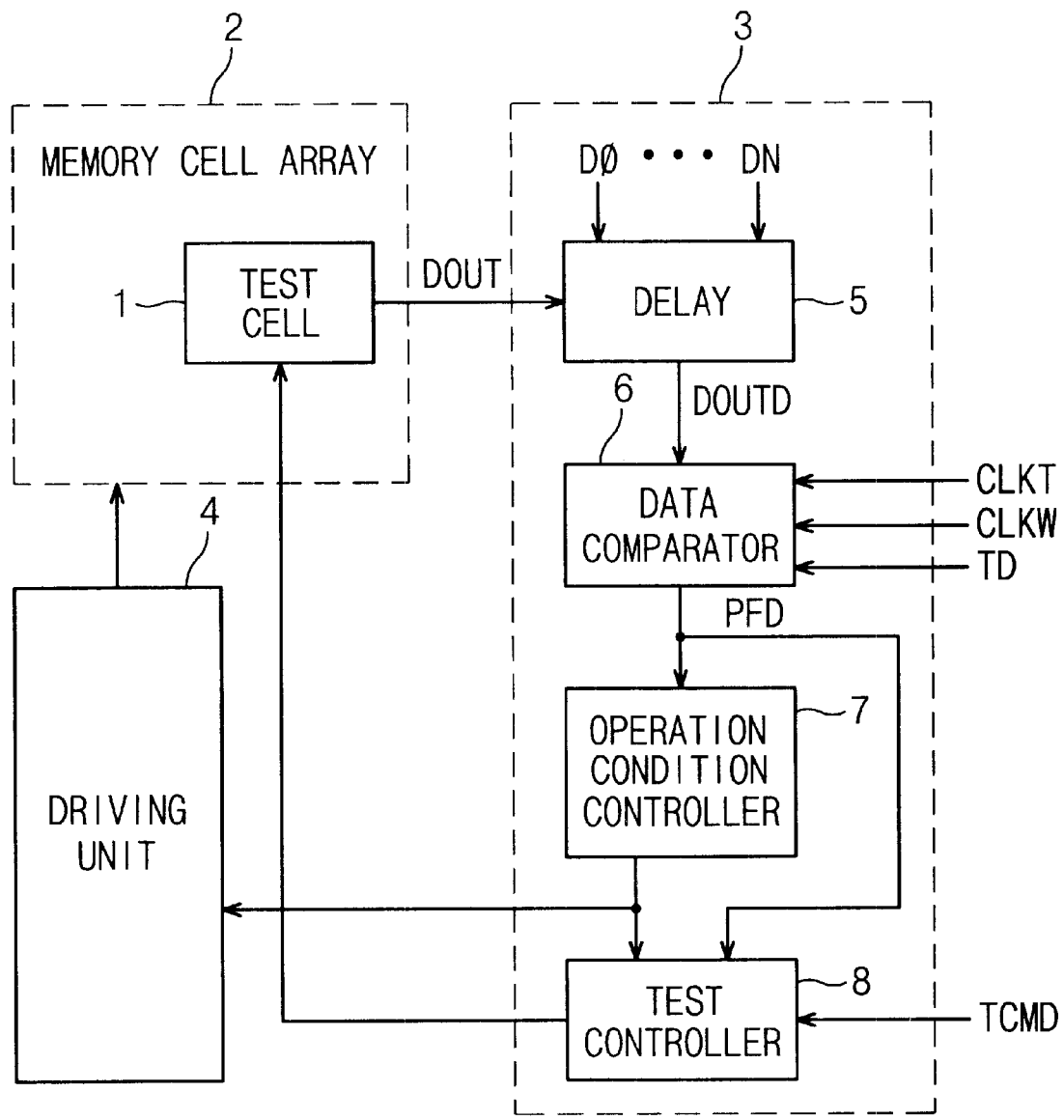
FIG. 1 is a block diagram illustrating relevant portions of a semiconductor memory device.

Turning now to FIG. 1, a semiconductor memory device includes a memory cell array 2 including a test cell 1, which is determined as a worst one among the cells passing a burn-in test. The semiconductor memory device also includes a test unit 3 for testing the test cell 1 and outputting the operation conditions as a testing product, as well as a driving unit 4 for driving the memory cell array 2 using the operation conditions from the test unit 3.

The test unit 3 includes a delay 5 for delaying the data DOUT stored in the test cell for a predetermined time and a data comparator 6 for comparing the delayed data DOUTD with a test data TD, and outputting the comparing result signal PFD. The test unit 3 also includes an operation condition controller 7 for controlling the operation conditions according to the comparing result signal PFD and a test controller 8 for controlling a test operation for storing and reading the test data TD in/from the test cell 1 using the operation conditions from the operation condition controller 7.

The test cell 1 is the worst cell among the cells passing in the burn-in test. For a normal operation, the test cell 1 is repaired by a synchronous RAM-type repair cell by using an anti-fuse.

Here, an address of the test cell 1 is marked so that a succeeding test can be executed not on the repaired cell, but on the test cell 1. That is, the address of the test cell 1 is stored in the test controller 8, and the test controller 8 stores the test data TD into the test cell 1. As a result, the test controller 8 reads the data from the test cell 1.

The test controller 8 executes the test in response to the test command TCMD. However, when the current test condition is a test for controlling a refresh period, the test controller 8 can automatically execute the test without regard for the test command TCMD.

Figure 5:
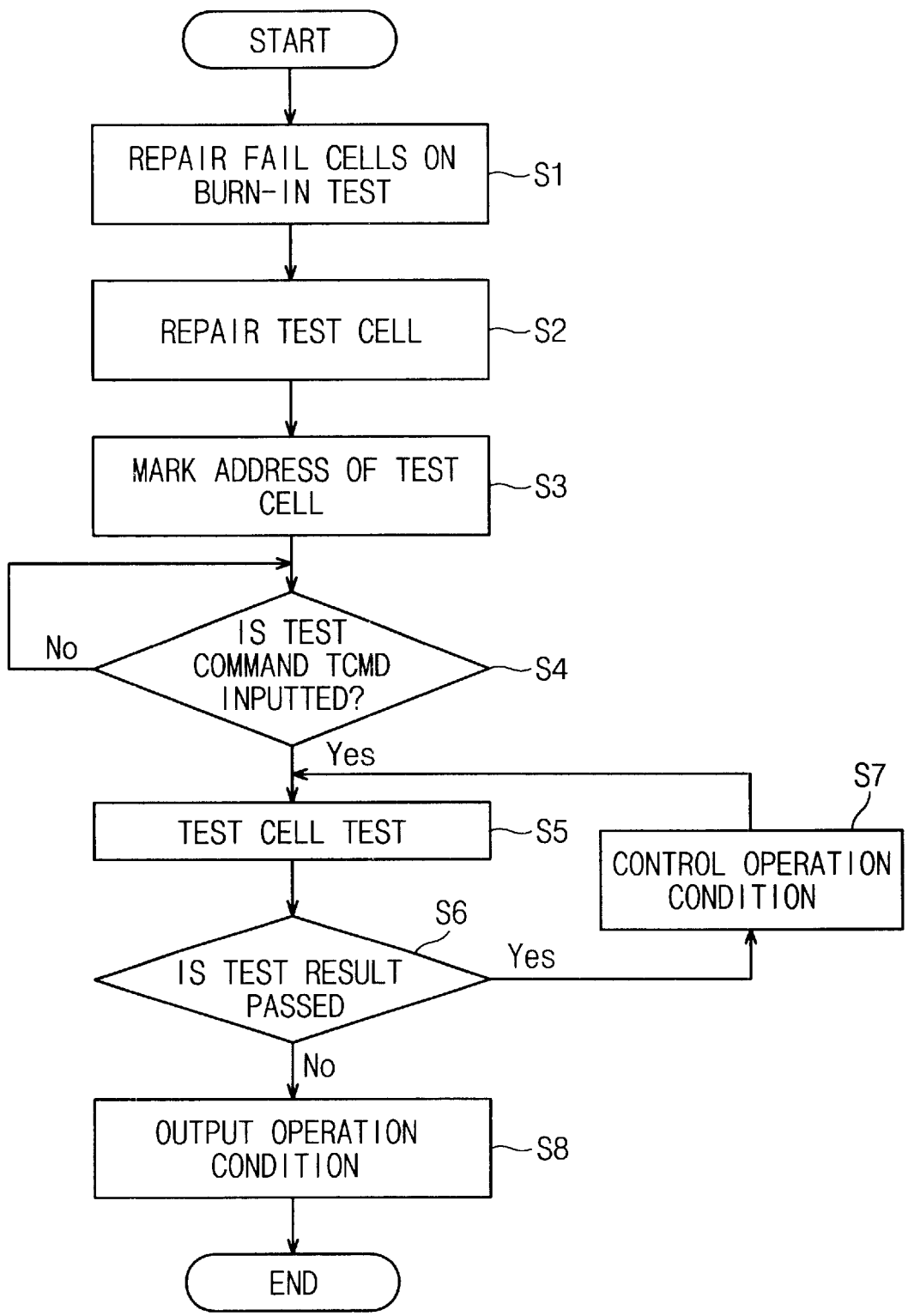
FIG. 5 is a flowchart showing steps of a method for testing the semiconductor memory device of FIG. 1.

The operation of the disclosed semiconductor memory device is described with reference to FIG. 5.

The burn-in test is performed, and the failed cells are repaired by using the anti-fuse (S1).

The test cell 1, which may easily fail among the passed cells in the burn-in test, is detected and repaired by using the anti-fuse (S2).

Here, the address of the test cell 1 is marked (S3). The reason the test cell 1 is marked is so that a succeeding test may be performed on the test cell 1, not the repair cell corresponding to the test cell 1.

An input of the test command TCMD is confirmed (S4). If the test command TCMD is inputted, the test is executed on the test cell 1 in the current operation conditions (S5).

Thereafter, the test result is confirmed (S6). If the test cell 1 passes the test, the operation conditions are adjusted (S7). The test is then performed again under the adjusted operation conditions (S5).

The test result is confirmed (S6). If the test cell 1 fails in the test, the final operation conditions are outputted, and the normal operation is performed according to the final operation conditions (S8).

Figure 2:
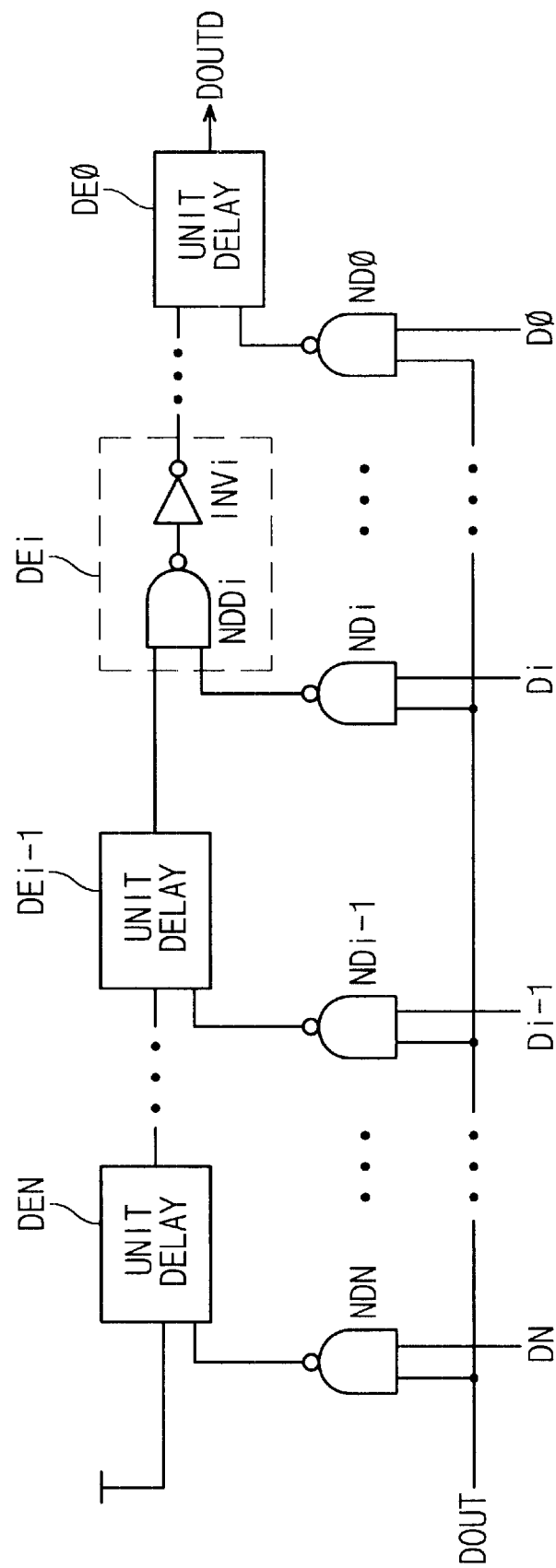
FIG. 2 is a detailed circuit diagram illustrating the delay of FIG. 1.

FIG. 2 is a detailed circuit diagram illustrating the delay 5 of the test circuit of the semiconductor memory device in FIG. 1. As illustrated in FIG. 2, the delay 5 includes a plurality of NAND gates ND0-NDN, each having one input terminals connected to receive control signals D0-DN, and each having the other input terminals connected to receive the data (DOUT) read from the test cell 1. The NAND gates control a delay rate according to the control signals D0-DN. The delay 5 also includes a plurality of unit delays DE0-DEN, which are controlled according to output signals from the NAND gates ND0-NDN, for delaying output signals from the preceding unit delays for a predetermined time.

The unit delay DEi includes a NAND gate NDDi having one input terminal connected to receive an output signal from the preceding unit delay DEi-1, and the other input terminal connected to receive an output signal from a NAND gate NDi. The unit delay DEi also includes an inverter INVi for inverting an output signal from the NAND gate NDDi.

The data DOUT read from the test cell 1 is delayed using the delay 5. When a failure occurs because the data DOUT read from the test cell 1 is not identical to the test data TD, the test conditions are applied to the other cells connected to the identical word line of the test cell. As a result, in order to generate a non-failure state due to the failure, the data DOUT read from the test cell 1 is delayed for a predetermined time, thereby obtaining a margin of failure generation conditions.

Figure 3:
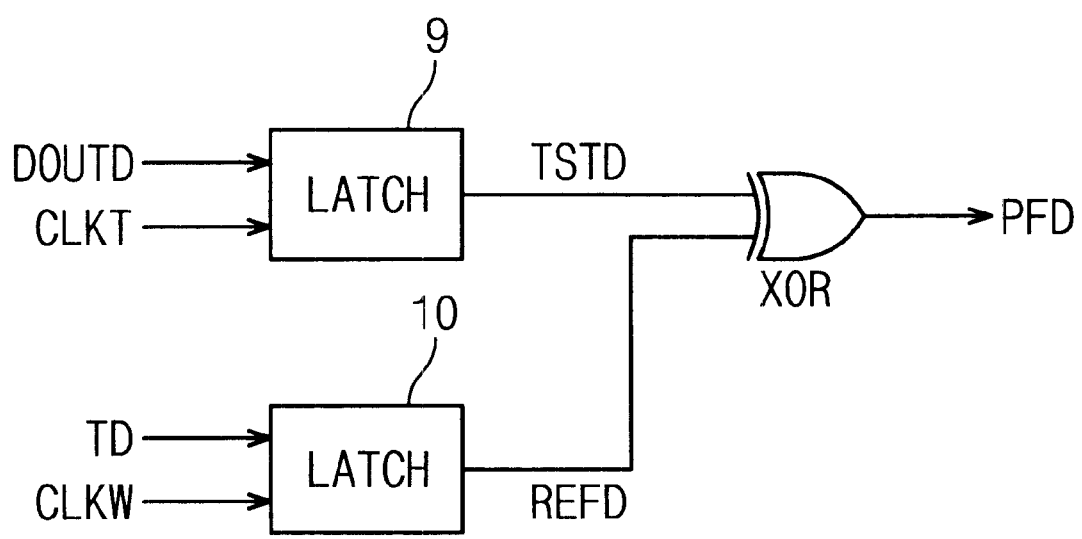
FIG. 3 is a detailed block diagram illustrating the data comparator of FIG. 1.

FIG. 3 is a detailed block diagram illustrating the data comparator 6 of the semiconductor memory device of FIG. 1. As depicted in FIG. 3, the data comparator 6 includes a latch 9 for latching the data DOUTD delayed by the delay 5 and outputting a data TSTD latched according to a clock signal CLKT, a latch 10 for latching the test data TD and outputting a data REFD latched according to a clock signal CLKW and an exclusive OR gate XOR for comparing the data TSTD and REFD from the latches 9 and 10 and outputting the comparison result signal PFD.

In detail, the latch 9 latches the data DOUTD obtained by delaying the data DOUT read from the test cell 1 by the delay 5, and outputs the latched data TSTD synchronized with the clock signal CLKT pursuant to the test operation period.

The latch 10 latches the test data TD stored in the test cell 1, and outputs the latched data REFD in synchronization with the clock signal CLKW in accordance with a time of enabling the word line connected to the test cell 1 to write the test data TD in the test cell 1.

The exclusive OR gate XOR compares the data TSTD and REFD from the two latches 9 and 10. When the data are identical, the exclusive OR gate has a pass result, and outputs a low level comparison result signal PFD. When the data are different, the exclusive OR gate has a failure result, and outputs a high level comparison result signal PFD.

If the current test condition is a refresh period test, when the test result is passed by the data comparator 6, the operation condition controller 7 controls a parameter tREF so that the refresh period can be increased longer than the refresh period of the test. When the data comparator 6 indicates that the operation condition controller 7 does not control the refresh period, but outputs the refresh period of the test.

When the current test condition is a test for controlling an enable speed of a sense amplifier, and the test result is passed by the data comparator 6, the operation condition controller 7 delays the enable speed of the sense amplifier so that the test controller 8 can perform the test again. When the data comparator 6 indicates that the test result is failed, the operation condition controller 7 does not control the enable speed of the sense amplifier, but outputs the enable speed of the sense amplifier of the test.

When the current test condition is a test for controlling the refresh period and the enable speed of the sense amplifier. When the data comparator 6 indicates that the test result is passed, the operation condition controller 7 adjusts a refresh-related parameter to control the refresh period, controls the enable speed of the sense amplifier, and executes the test again. When the data comparator 6 indicates that the test result is failed, the operation condition controller 7 outputs the refresh period and the enable speed of the sense amplifier of the test.

Although the comparison result signal PFD of the data comparator 6 shows failure, the data DOUT read from the test cell 1 is delayed by the delay 5, and thus the test cell 1 is passed in the current test conditions.

Figure 4:
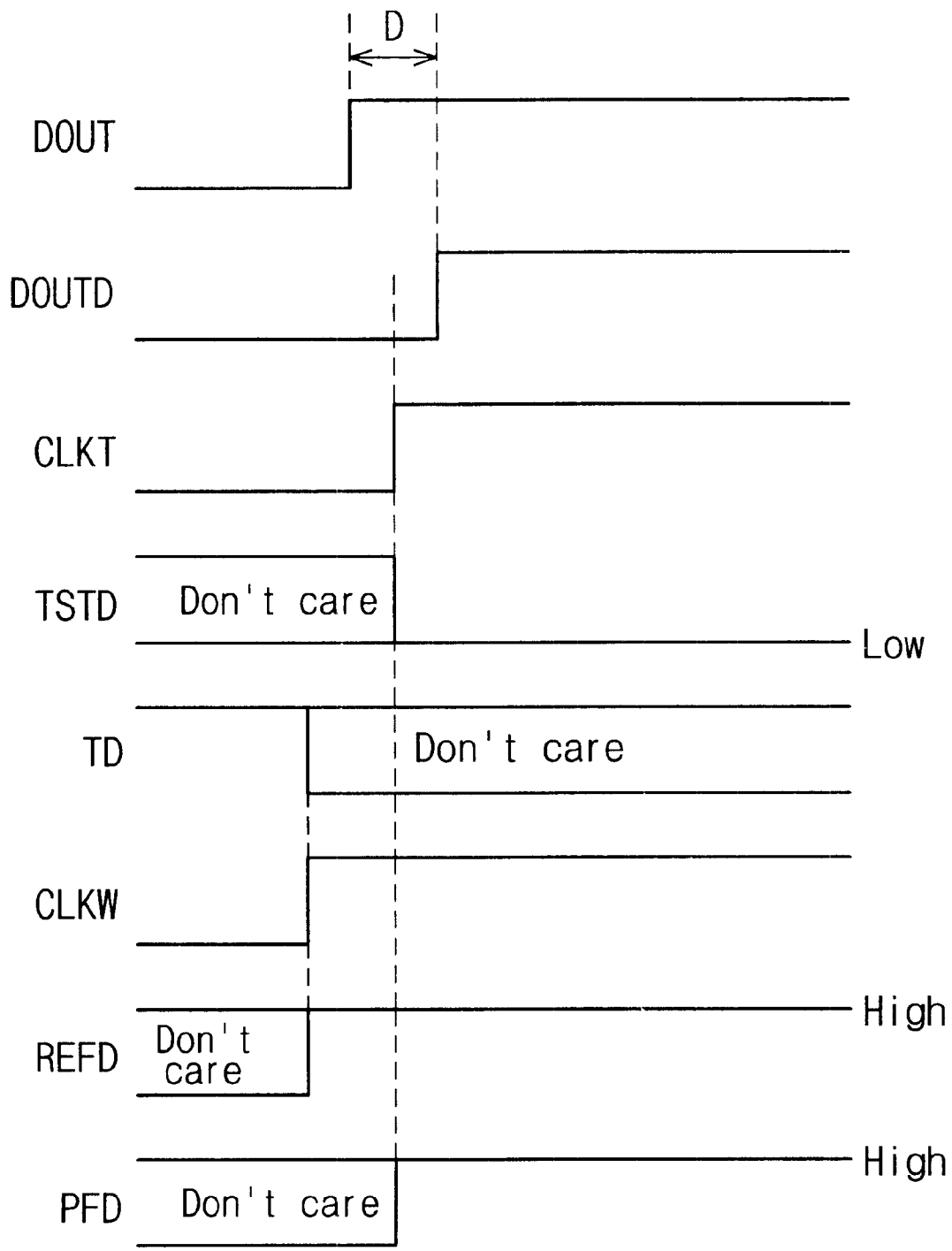
FIG. 4 is a timing diagram of an operation for comparing data in the data comparator of FIG. 3.

Referring to FIG. 4, the latch 9 latches the data DOUTD delayed by the delay 5, and outputs the data TSTD latched according to the clock signal CLKT. The latch 10 latches the test data TD, and compares the test data TD with the latched data REFD outputted according to the clock signal CLKW. The data REFD latched by the latch 10 has a high level, and the data TSTD latched by the latch 9 has a low level, thus generating failure. However, since the data DOUT read from the test cell 1 has a high level, it is passed in the current operation conditions.

Here, a delay rate D of the delay 5 is optionally set up by adjusting the control signals D0-DN. Although the test cell 1 is actually passed in the data comparator 6, it has a margin detected as failure.

In one example of the semiconductor memory device, when the operation condition relates to the refresh period, the test is executed regardless of the test command TCMD (S5). When the test result is 'pass,' the test is re-performed with a reduced refresh period (S5). When the test result is 'failure,' the test controller 8 does not perform the test, but outputs the refresh period of the test to the driving unit 4 (S8). The driving unit 4 performs the refresh operation by employing the inputted refresh period from the test controller 8.

In another example of the semiconductor memory device, when the operation condition relates to the enable speed of the sense amplifier, the test is executed according to input of the test command TCMD (S5). When the test result is 'pass,' the test is re-performed by delaying the enable speed of the sense amplifier (S5). When the test result is 'failure,' the test controller 8 does not perform the test, but outputs the enable speed of the sense amplifier of the test to the driving unit 4 (S8). Then, the driving unit 4 performs the normal operation such as a read or write operation employing the inputted enable speed of the sense amplifier.

In addition, in a situation in which the operation conditions is to control the refresh speed and the enable speed of the sense amplifier, the test is executed (S5). When the test result is 'pass,' the test is performed by reducing the refresh period (S5), and the test is performed by delaying the enable speed of the sense amplifier (S5), thereby optimizing the refresh period and the enable speed of the sense amplifier. When the test result is 'failure,' the normal operation is performed using the operation conditions of the test, namely the refresh period and the enable speed of the sense amplifier.

As discussed earlier, the semiconductor memory device can be operated by executing the test for controlling the refresh period and setting up the minimum refresh period. In addition, the test circuit of the semiconductor memory device can be operated by executing the test for controlling the enable speed of the sense amplifier and setting up the maximally-delayed enable speed of the sense amplifier. It is possible to individually perform the test for controlling the refresh period and the test for controlling the enable speed of the sense amplifier. The two tests may also be executed to control the refresh period of the semiconductor memory device and the enable speed of the sense amplifier. Here, the test for controlling the refresh period and the test for controlling the enable speed of the sense amplifier can be sequentially or simultaneously performed.

In accordance with the disclosure, the test circuit of the semiconductor memory device sets up the operation conditions of the semiconductor memory device in regard to the cell that may easily fail in the test, optimizes the operation conditions, and thus reduces power consumption in the refresh or active operation.

The disclosed semiconductor memory device and a method for testing the same can optimize operation conditions to reduce power consumption. The disclosed device and method test a test cell, which may easily fail in the test among the passed memory cells, and detect the worst operation conditions in which the whole memory cell array and cells can be operated without an error.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A semiconductor memory device comprising:
   a memory cell array comprising a test cell determined as a worst one among the memory cells passing a first test;
   a test unit for performing a second test on the test cell in predetermined operation conditions, repeatedly performing the second test after adjusting the operation conditions of the test cell according to the result of the second test and finally outputting the final operation conditions; and
   a driving unit for driving the memory cell array by using the final operation conditions from the test unit.

2. The device according to claim 1, wherein the test unit comprises:
   a delay for reading data stored in the test cell, and delaying the data for a predetermined time;
   a data comparator for comparing the delayed data with a test data, and outputting the comparison result;
   an operation condition controller for adjusting the operation conditions according to the comparison result from the data comparator; and
   a test controller for controlling the second test in which the test data is stored and read from/to the test cell in the adjusted operation conditions.

3. The device according to claim 2, wherein the delay comprises a plurality of unit delays controlled according to a plurality of control signals, for adjusting a delay rate.

4. The device according to claim 2, wherein the data comparator comprises:
   a first latch for latching a data delayed by the delay, and outputting the latched data;
   a second latch for latching the test data, and outputting the latched data; and
   a comparator for comparing data outputted from the first and second latches, and outputting a comparison result signal.

5. The device according to claim 4, wherein the first latch is synchronized with a clock signal pursuant to a test operation period, for outputting the latched data.

6. The device according to claim 4, wherein the second latch is synchronized with a clock signal in accordance with a time of enabling a word line connected to the test cell to write the test data to be stored in the test cell, for outputting the latched data.

7. The device according to claim 2, wherein the operation condition controller controls a refresh period by adjusting an operation parameter according to the comparison result of the data comparator.

8. The device according to claim 2, wherein the operation condition controller controls an enable speed of a sense amplifier by adjusting a skew of a sense amplifier enable signal according to the output signal from the data comparator.

9. The device according to claim 2, wherein the operation condition controller controls a refresh period by adjusting an operation parameter according to the output signal from the data comparator, and controls an enable speed of a sense amplifier by adjusting a skew of a sense amplifier enable signal according to the output signal from the data comparator.

10. The device according to claim 2, wherein the test controller memorizes an address of the test cell.

11. A method for testing a semiconductor memory device, comprising:
   detecting a test cell which may easily fail among the cells passing a first test, repairing the test cell, and memorizing an address of the test cell;

a test step for performing a second test on the test cell in predetermined operation conditions by using the address of the test cell;

returning to the test step after adjusting the operation conditions, when the test cell passes the second test; and providing the operation conditions used in the second test as driving conditions of a memory cell array, when the test cell fails in the second test.

12. The method according to claim 11, further comprising comparing data obtained by delaying a data stored in the test cell for a predetermined time with test data.

13. The method according to claim 11, wherein the operation condition is a refresh period.

14. The method according to claim 13, wherein the second test is automatically performed when a refresh operation is performed.

15. The method according to claim 11, wherein the operation condition is an enable speed of a sense amplifier.

16. The method according to claim 15, further comprising confirming of the input of a test command, and performs the second test when the test command is inputted.

17. The method according to claim 11, wherein the operation condition is a refresh period and an enable speed of a sense amplifier.

* * * * *

UNITED STATES PATENT AND TRADEMARK OFFICE
CERTIFICATE OF CORRECTION

PATENT NO. : 6,650,581 B2
DATED : November 18, 2003
INVENTOR(S) : Sang H. Hong et al.

It is certified that error appears in the above-identified patent and that said Letters Patent is hereby corrected as shown below:

<u>Title page,</u>
Item [73], Assignee, please delete "Kyoungki-Do" and replace with -- Kyoungki-do --.

Signed and Sealed this

Fourth Day of May, 2004

JON W. DUDAS
*Acting Director of the United States Patent and Trademark Office*